June 14, 1966 C. J. FRENZEL 3,255,525

CUTTING TOOL OR THE LIKE

Filed April 26, 1963

2 Sheets-Sheet 1

INVENTOR.
Carl J. Frenzel,
BY
Greist, Lockwood, Greenawalt & Dewey
Attys.

June 14, 1966 C. J. FRENZEL 3,255,525

CUTTING TOOL OR THE LIKE

Filed April 26, 1963 2 Sheets-Sheet 2

INVENTOR.
Carl J. Frenzel,
BY
Greist, Lockwood, Greenawalt & Dewey.
Attys.

United States Patent Office 3,255,525

Patented June 14, 1966

3,255,525

CUTTING TOOL OR THE LIKE

Carl J. Frenzel, Chicago, Ill., assignor to Skil Corporation, Chicago, Ill., a corporation of Delaware Filed Apr. 26, 1963, Ser. No. 275,810

6 Claims. (Cl. 30—180)

This invention relates to tools, and more particularly to a new and improved fluid pressure operated cutting tool or the like.

Recently, printed circuit boards have achieved widespread commercial use. As it is known to those skilled in the art, these boards are made of a suitable dielectric material having metallic strips formed or printed thereon. Small holes are provided in the board at spaced-apart locations along the various metallic strips for receiving the ends of lead wires to be attached to the circuit board. In attaching lead wires to circuit boards it has become the practice to insert one end of a lead wire through its associated hole in the circuit board and deposit a small drop of solder on this end of the lead wire and on the metallic strip thereby securing the lead wire to the circuit board and forming an electrical connection between the metallic strip and lead wire. Most often the tip of the lead wire projects slightly above the solidified drop of solder, and this tip is severed in the interest of making the connections between the lead wires and the circuit board as neat and compact as possible. It will be appreciated that a considerable number of lead wires are secured to the average printed circuit board; therefore, a considerable number of cutting or severing operations of the tips of lead wires is necessary during the assembly of a printed circuit board. Accordingly, the use of printed circuit boards has developed a need for a small and compact powered cutting device for cutting or trimming the tips of lead wires secured to a circuit board.

It is a primary object of the present invention to provide a new and improved fluid pressure operated cutting tool which is of simple construction and which is of light weight and compact design.

It is another object of the present invention to provide a fluid pressure operated cutting tool wherein the tool includes novel constructional features for preventing disalignment of moving members of the tool during a cutting operation.

It is even another object of the present invention to provide a fluid pressure operated cutting tool having a stationary and a movable working member each of which is provided with a cutting portion, and wherein adjustable means are provided for setting the maximum opening between the cutting portions.

It is a further object of the present invention to provide a fluid pressure operated cutting tool having a stationary and a movable working member each of which is provided with a cutting portion, wherein novel finger actuated means are provided for controlling the rate of closing movement of the cutting portions.

These and other objects and advantages of the present invention will become apparent from the following specification wherein like numerals refer to similar parts throughout.

Figures 1, 2, 3:
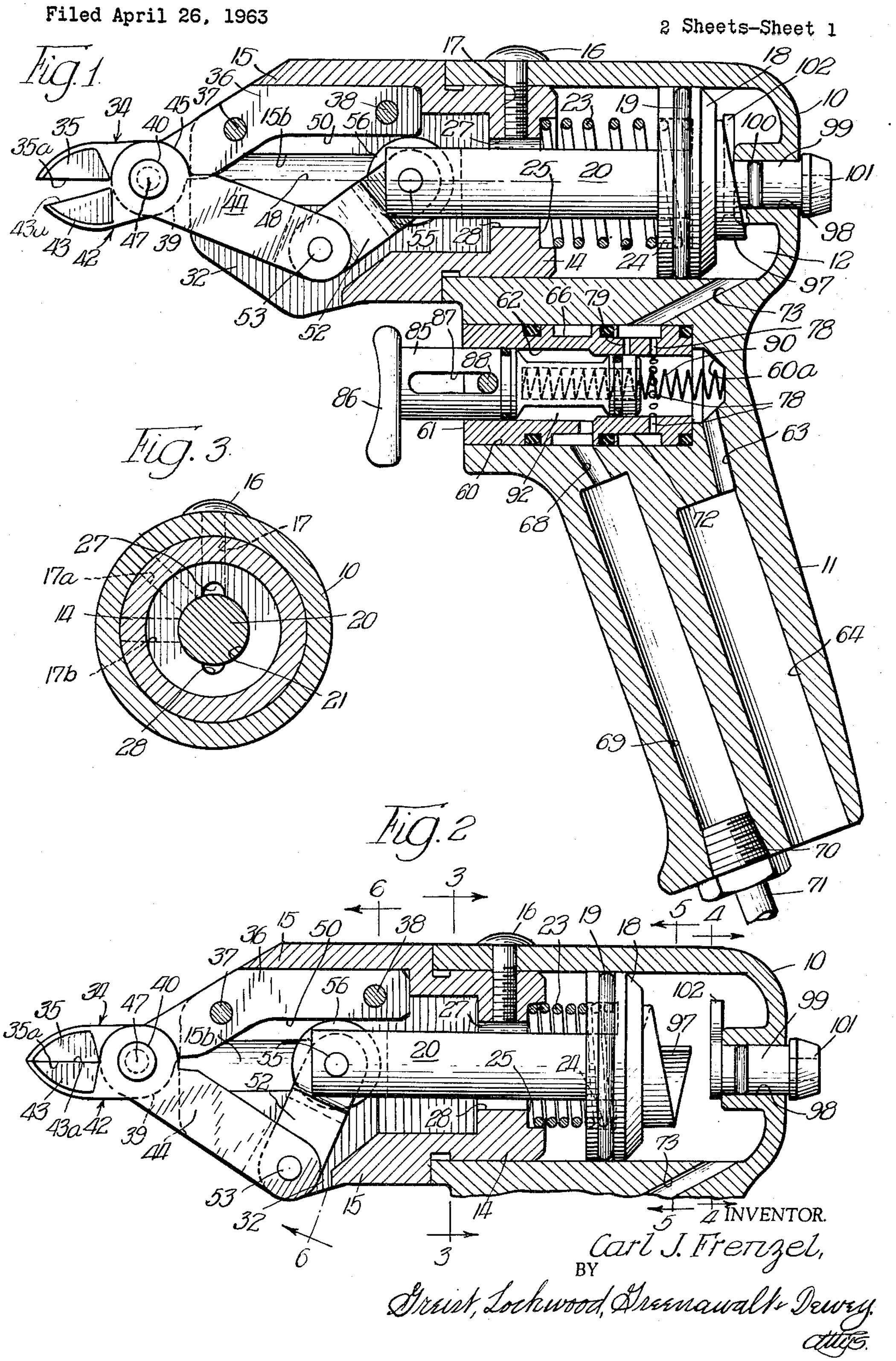
FIG. 1 is a partial elevation and partial central vertical section of one embodiment of the cutting tool of this invention.
FIG. 2 is a fragmentary partial elevation and partial central vertical section of the cutting tool of FIG. 1 showing the cutting portions of the working members of the tool in their fully closed position.
FIG. 3 is a section taken along line 3—3 of FIG. 2.

Now referring to the drawings and especially FIGS. 1 and 2, the embodiment of the cutting tool shown for purposes of illustration will be seen to include a generally cylindrical housing 10 having an integral depending pistol grip handle portion 11. Housing 10 includes a cylindrical chamber 12 closed at the rear end thereof and open at the front end thereof for snugly receiving a boss portion 14 of a sub-housing member 15. The subhousing member is adapted to be secured to housing 10 by means of a suitable fastener, such as a machine screw 16, adapted to be threadingly received in a transversely extending bore 17 in boss portion 14. Preferably, boss portion 14 includes a number of bores **17*a*, 17*b* (FIG. 3) at 45 and 90 degree angles to bore 17 for permitting the sub-housing to be rotated about its central axis and secured to the housing in a number of different positions. A piston 18 is reciprocal within chamber 12, and the piston is provided with an O-ring 19 encircling the same for forming a seal between the periphery of the piston and the walls of chamber 12. A piston rod 20 slidable in a bore 21 provided in boss portion 14 (FIG. 3) has the rear end thereof secured to piston 18. A coil spring 23 encircling the piston rod with one end of the spring being received in an annular recess 24 provided on the front face of the piston and with the other end of the spring being received in a circular recess 25 provided in the rear face of boss portion 14 constantly urges piston 18 rearwardly in chamber 12. A pair of diametrically oppositely disposed axially extending grooves 27 and 28 opening into bore 21 are provided in boss portion 14** of the sub-housing member.

Figures 4, 5, 6, 7:
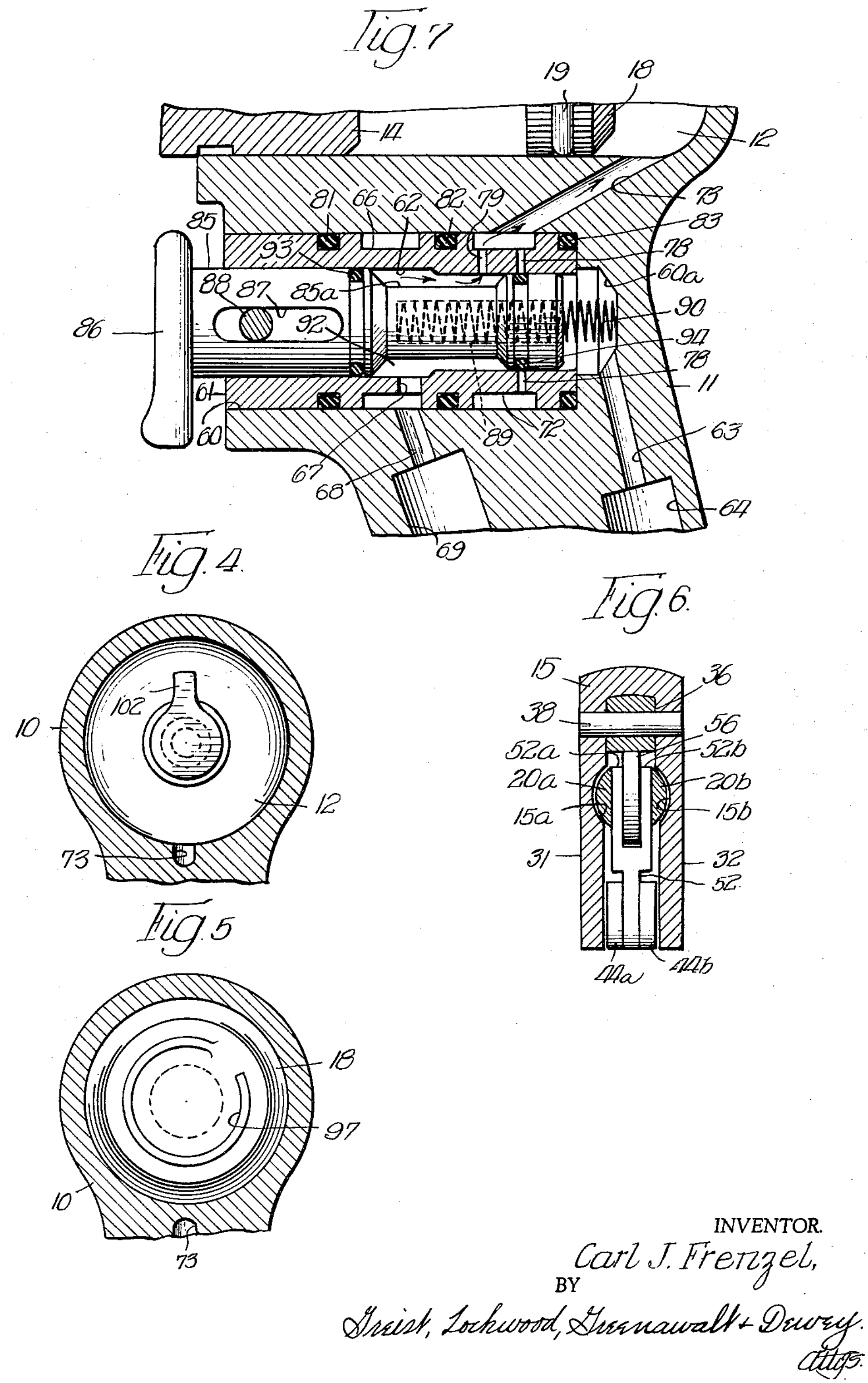
FIG. 4 is a section taken along line 4—4 of FIG. 2.
FIG. 5 is a section taken along line 5—5 of FIG. 2.
FIG. 6 is a section taken along line 6—6 of FIG. 2.
FIG. 7 is an enlarged fragmentary partial elevation and partial vertical section showing the actuating means for operating the cutting tool of FIG. 1.

Sub-housing member 15 is open at the front and forward lower portion thereof and includes parallel side wall portions 31 and 32 (FIG. 6). A generally elongated stationary working member, generally designated 34, having a cutting or working portion 35 at one end thereof and an arm portion 36 at the other end thereof is secured to the cutting tool housing by having arm portion 36 attached as by rivets or pins 37 and 38 between wall portions 31 and 32 of the sub-housing member. The stationary working member is provided with a pivot portion 39 intermediate its ends, which pivot portion is centrally bored for receiving a pivot pin 40. A generally elongated movable working member, generally designated 42, has a cutting or working portion 43 at one end thereof, an arm portion 44 at the other end thereof and a pivot portion 45 intermediate the ends thereof, which pivot portion is provided with a bore for rotatably receiving pin 40 to mount the movable working member pivotally on the stationary working member. The movable working member is adapted for pivoting movement about a pivot axis 47 extending through the center of pin 40, which axis intersects and is transverse to a longitudinal central axis 48 of housing 10 and chamber 12.

Cutting portion 35, which is inwardly offset from arm portion 36, includes a cutting edge **35*a* co-linear with central longitudinal axis 48. Arm portion 36 includes an elongated planar surface 50, which planar surface opens within sub-housing 15 and extends longitudinally thereof in parallel spaced-apart relation with axis 48. Cutting portion 43 of the movable working member includes a cutting edge 43*a* adapted for co-extensive contact with cutting edge 35*a* upon closing of cutting portion 43 with respect to cutting portion 35. Arm portion 44 of the movable working member is inclined from cutting portion 43 in a plane perpendicular to pivot axis 47**.

It will be apparent that spreading movement of arm portion 44 with respect to arm portion 36 will result in closing of cutting portion 43 with respect to cutting portion 35.

The arm portion of movable working member 42 is bifurcated at the free end thereof for forming parallel spaced-apart ear portions **44*a* and 44*b* (FIG. 6). A link member 52 is adapted to have the lower end thereof pivotally secured between the ear portions by a pin 53. The upper end of link 52 is in the form of a yoke including yoke members 52*a* and 52*b*. The forward end of piston rod 20 is bifurcated forming parallel spaced-apart ear portions 20*a* and 20*b*. Ear portions 20*a*, 20*b* and yoke portions 52*a*, 52*b* are provided with aligned openings of receiving a pin 55 for pivotally attaching the upper end of link 52 to the forward end of piston rod 20. A roller 56 is rotatably mounted on pin 55 between the yoke portions of link 52. It will be understood that link 52 is adapted to pivot freely with respect to a piston rod 20, and roller 56 is adapted to roll freely on pin 55. Roller 56 is adapted for rolling movement along planar surface 50 during reciprocatory movement of the piston rod, which piston rod is co-axial with longitudinal central axis 48. Sub-housing 15 includes opposed axially extending recesses 15*a* and 15*b*** permitting free reciprocatory movement of the piston rod in the sub-housing.

It will be apparent that forward movement of piston rod 20 results in spreading or opening of arm portion 44 with respect to arm portion 36 and closing of cutting portion 43 with respect to cutting portion 35 for bringing together cutting edges **35*a* and 43*a* to cut or sever an object placed between the cutting portions of the working members. When an object, such as a wire for example, is being severed between cutting edges 45*a* and 43*a*, the resultant force acting on cutting portion 43 tends to cause opening of cutting portion 43 with respect to cutting portion 35 and corresponding closing of arm portion 44 with respect to arm portion 36. This closing movement of arm portion 44 exerts a force on the forward end of the piston rod tending to move the latter out of axial alignment by virtue of the connection between the free end of arm portion 44 and the forward end of the piston rod by link 52. However, the piston rod is prevented from being disaligned within the housing by rolling engagement of roller 56 with planar surface 50 of the stationary working member. By reason of the rolling engagement of roller 56 with planar surface 50, piston rod 20, link 52** and the movable working member operate in a smooth manner without any tendency toward binding when objects are being severed between the cutting portions of the working members.

Piston 18 is adapted to be moved forwardly for closing the cutting portions of the working members by admitting a fluid under pressure into chamber 12. During forward movement of the piston, air in chamber 12 forward of the piston is allowed to escape to atmosphere through grooves 27 and 28. In the embodiment of the cutting tool shown for purposes of illustration, the piston is adapted to be pneumatically actuated and means are provided for controlling the admission of air into chamber 12 for controlling the rate of closing movement of cutting portion 43 with respect to cutting portion 35.

Referring now to FIGS. 1 and 7, handgrip portion 11 of the cutting tool housing includes a bore 60 open at the forward end thereof for receiving a valve bushing 61. Bushing 61 is provided with a central axially extending through bore 62. Bore 60 includes an extension **60*a* communicating with bushing bore 62 at the rear end thereof, which extension 60*a* is open to atmosphere through discharge passageways 63 and 64. An annular inlet chamber is defined by providing bushing 61 with an annular recess 66, which recess communicates with bore 62 by means of an inlet port 67. Inlet port 67 is in communication with inlet passageways 68 and 69, which last mentioned inlet passageway has the lower end thereof adapted for threading engagement with a plug 70 for attaching an air hose 71, for example, to the cutting tool for admitting a fluid under pressure to the inlet passageways. An annular outlet chamber is defined by providing bushing 61 with an annular recess 72, which recess is spaced apart from recess 66 along the longitudinal central axis of the bushing. The outlet chamber defined by recess 72 is in communication with chamber 12 by means of a passageway 73**.

A plurality of radially disposed primary outlet ports 78 communicate bore 62 with the annular outlet chamber defined by recess 72. All primary outlet ports 78 lie in a common plane transverse to the longitudinal central axis of bore 62. A radially disposed secondary outlet port 79 also communicates bore 62 with the annular outlet chamber defined by recess 72; port 79 opens into bore 62 at a point therealong intermediate inlet port 67 and outlet ports 78. Bushing 61 includes three annular recesses spaced-apart along the length of the bushing for receiving O-rings 81, 82 and 83 for forming a seal between the exterior of the bushing and bore 60 and for preventing communication between the annular chambers defined by recesses 66 and 72.

A plunger or valve stem 85 is adapted to be slidably received within bore 62 for reciprocal movement in the latter. Plunger 85 has a finger engaging pad 86 secured to the forward end thereof, and the plunger includes a transversely and longitudinally extending slot 87 adapted for slidably receiving a transversely extending pin 88, which pin has opposite ends thereof secured in suitable aligned bores (not shown) in bushing 61 and handgrip portion 11. Pin 88 maintains bushing 61 in bore 60, prevents separation of the plunger from the bushing and controls the limits of forward and rearward movement of the plunger in the bushing. Plunger 85 includes a central axially extending bore 89 in the rear end thereof for receiving a coil spring 90, which spring is adapted to have the rear end thereof in engagement with an end wall of bore extension **60*a*. Spring 90 constantly urges plunger 85 to its forwardmost position in bore 62**.

Plunger 85 includes a reduced in diameter annular portion **85*a* defining an annular space 92 in bore 62. It will be noted that plunger 85 has a greater diameter at the forward end thereof than at its rearward end thereby resulting in a conical surface at the forward end of annular portion 85*a* of greater surface area than the area of the opposite conical surface at the rear end of portion 85*a*. This provides an unbalanced effect on the plunger for urging the latter to its forward or closed position. The plunger is provided with a pair of annular recesses at respective opposite ends of annular portion 85*a* for receiving a pair of O-rings 93 and 94 for sealing annular space 92** at opposite ends of the latter.

FIG. 1 illustrates plunger 85 in its forwardmost or off position. A fluid under pressure, such as compressed air from hose 71, will be admitted into annular space 92 through inlet port 67 and passageways 68 and 69. As annular space 92 is not in communication with either secondary outlet port 79 or primary outlet ports 78, air under pressure in annular space 92 will not be admitted into cylindrical chamber 12. Accordingly, with plunger 85 in the position indicated in FIG. 1, forward movement will not be imparted to piston 18. Initial rearward movement of plunger 85, as by engagement of an operator's finger with pad 86, results in communication of secondary outlet port 79 with annular space 92 and closing of outlet ports 78 by the rear end of the plunger. This position of the plunger is illustrated in FIG. 7. It will be realized that the length of plunger annular portion **85*a* is sufficient to provide constant communication between inlet port 67 and the annular space during full reciprocal movement of the plunger. It will be apparent that when secondary outlet port 79 is placed in communication with annular space 92, air under pressure in the latter will be admitted into chamber 12 through passageway 73 for imparting forward movement to piston 12. As only one secondary outlet port is provided and because this port has a relatively small diameter, air under pressure is admitted into chamber 12 at a relatively slow rate thereby resulting in relatively slow forward movement of piston 18. This relatively slow forward movement of the piston causes corresponding slow closing movement of cutting portion 43 with respect to cutting portion 35. This slow closing movement allows an operator of the cutting tool to position cutting portions 35, 43 more accurately on an object to be severed and allows cutting edges 35***a* and 43*a* to be slowly brought into contact with the surface of the object. Continued rearward movement of plunger 85 results in communication between annular space 92 and all primary outlet ports 78. When the plunger is in the position just mentioned, a maximum flow of air under pressure will be admitted to cylindrical chamber 12 through the annular chamber defined by recess 72 and through passageway 73 for causing rapid forward movement of piston 18. This rapid forward movement of piston 18 causes cutting edge 43*a* of cutting portion 43 to be brought into contact quickly and sharply with cutting edge 35*a* of cutting portion 35 for severing or cutting an object disposed between the cutting portions of the working members.

In the embodiment of the invention illustrated one secondary outlet port and a plurality of primary outlet ports are shown. The exact number of secondary and primary outlet ports may be varied according to various cutting tool design requirements. Several secondary ports might be provided; they need only be of a number and diameter for admitting a fluid under pressure at a relatively slow rate into chamber 12 for causing relatively slow movement of piston 18. The primary outlet ports need be of a number and size for admitting a fluid under pressure at a high rate into chamber 12 for causing rapid forward movement of piston 18.

It will be apparent that upon release of the plunger, the unbalanced feature of the latter and spring 90 will return the plunger to the position shown in FIG. 1 thereby preventing communication between annular space 92 and the secondary and primary outlet ports. Release of the plunger allows spring 23 to return piston 18 to its rearward position in chamber 12. Fluid in chamber 12 between the rear end of the latter and piston 18 is discharged to atmosphere through passageway 73, outlet ports 78, bore 62, bore extension 60*a*, passageway 63 and discharge passageway 64. It will be noticed that when plunger 85 is in its forwardmost position (FIG. 1) the rear end of the latter does not cover outlet ports 78.

The cutting tool of this invention includes means for adjusting the limit of the rearward stroke of piston 18 in chamber 12. It will be apparent that rearward movement of the piston by spring 23 results in opening of cutting portion 43 with respect to cutting portion 35. Accordingly, limiting the amount of rearward movement of piston 18 provides a means for controlling the maximum opening between cutting portions 35 and 43. This feature allows an operator of the cutting tool to adjust the maximum opening between the tool cutting portions to accommodate the particular work to be cut or severed: For example, if very small diameter wire is to be severed by the cutting tool of this invention, only a small opening between cutting edges 35*a* and 43*a* is needed for admitting the wire therebetween. In other words, the space between the cutting edges at points about midway along the lengths of the latter need only be approximately as wide as the diameter of the wire to be cut. By adjusting the maximum opening between the cutting portions to accommodate the size of a particular object to be cut, the amount of swinging movement required of the movable working member to cut a particular object is reduced. Further, adjusting the maximum opening between the cutting portions of the working members to accommodate a particular object to be cut aids the operator of the cutting tool to position the cutting portions on the work.

The means for adjusting the maximum opening between the cutting portions of the working members includes an elongated cam 97, as best seen in FIGS. 2 and 5. Cam 97 is in the form of an arcuate or curved wall projecting rearwardly from the rear face of piston 18, with the center of curvature of the wall being co-axial with the longitudinal central axis 48 of chamber 12. Cam wall 97 uniformly increases in height along the length thereof. Housing 10 includes a bore 98 at the rear end thereof, which bore is co-axial with axis 48 and rotatably receives a shaft 99. Shaft 99 includes an annular recess for receiving an O-ring 100 for forming a seal between bore 98 and shaft 99. The outer end of shaft 99 is provided with finger gripping means in the form of a knob 101. The forward end of shaft 99 has secured thereto a transversely extending arm member 102 (FIG. 4). Rearward movement of piston 18 by spring 23 is limited by engagement of the inclined surface of cam wall 97 with arm 102. By virtue of the inclined surface of the cam, rotation of shaft 99 by knob 101 results in forward or rearward movement of the piston depending on the direction of rotation of shaft 99. For example, in the embodiment of the cutting tool illustrated, rotation of shaft 99 in a clockwise direction (as seen from the rear of the cutting tool) results in rearward movement of piston 18 in chamber 12. In effect, arm 102 and cam 97 act as an adjustable stop means for limiting the length of the rearward stroke of piston 18. It should be apparent that rotation of knob 101 will result in opening or closing of cutting portion 43 with respect to cutting portion 35 depending on the direction of rotation of knob 101. Spring 23 maintains the inclined surface of cam 97 in constant engagement with arm 102 during adjustment of the opening between the cutting portions of the working members.

While the invention has been shown in but one form it will be obvious to those skilled in the art that it is not to be so limited, but on the other hand it is susceptible of various changes and modifications without departing from the spirit and scope of the appended claims. For example, it will be realized that the cutting portions of the working members may be modified to perform a crimping, clinching or holding operation.

I claim:

1. A fluid pressure operated tool comprising, a generally cylindrical housing having an opening in the front end thereof and having a longitudinal central axis, an elongated stationary working member including a first working portion at one end thereof and a first arm portion at the other end thereof, said first arm portion being secured to a side wall of said housing adjacent said front end thereof and including an elongated planar surface disposed within the interior of the housing and extending longitudinally thereof, said planar surface being offset from said central axis, an elongated movable working member including a second working portion at one end thereof and a second arm portion at the other end thereof, said movable and stationary working members being pivotally secured to each other intermediate their ends for pivoting movement of the movable working member about a pivotal axis transverse to said central axis, said stationary and movable working members being mutually configured to provide closing of said second working portion relative to said first working portion upon spreading of said second arm portion relative to said first arm portion, said housing including a cylindrical chamber having a piston reciprocal therein, a piston rod co-axial with said central axis and having the rear end thereof secured to said piston, means mounted on the front end of said piston rod and engageable with said planar surface, which means remains in constant engagement with said planar surface along the length of the latter during reciprocal movement of said piston, said housing including finger actuated means for admitting a fluid under pressure into said chamber for imparting forward movement to said piston, linkage means pivotally securing the front end of said piston rod with said second arm portion for spreading of the latter relative to said first arm portion upon forward movement of the piston, whereby said piston rod mounted means prevents disalignment of said piston rod when a piece of work is being worked by said first and second working portions.

2. A fluid pressure operated cutting tool comprising, a generally cylindrical housing having an opening in the front end thereof and having a longitudinal central axis, an elongated stationary working member including a first cutting portion at one end thereof and a first arm portion at the other end thereof, said first arm portion being secured to a side wall of said housing adjacent said front end thereof and including an elongated planar surface disposed within the interior of the housing and extending longitudinally thereof, said planar surface being offset from said central axis, an elongated movable working member including a second cutting portion at one end thereof and a second arm portion at the other end thereof, said movable and stationary working members being pivotally secured to each other intermediate their ends for pivoting movement of the movable working member about a pivotal axis transverse to said central axis, said stationary and movable working members being mutually configured to provide closing of said second cutting portion relative to said first cutting portion upon spreading of said second arm portion relative to said first arm portion, said housing including a cylindrical chamber having a piston reciprocal therein, a piston rod co-axial with said central axis and having the rear end thereof secured to said piston, a roller mounted on the front end of said piston rod, which roller is adapted to roll on said planar surface during reciprocal movement of said piston, said housing including finger actuated means for admitting a fluid under pressure into said chamber for imparting forward movement to said piston, a link having one end thereof pivotally secured to the front end of said piston rod and having the other end thereof pivotally secured to said second arm portion for spreading of the latter relative to said first arm portion upon forward movement of the piston, whereby said roller prevents disalignment of said piston rod when a piece of work is being severed by said first and second cutting portions.

3. A fluid pressure operated cutting tool comprising, a generally cylindrical housing having an opening in the front end thereof and having a longitudinal central axis, an elongated stationary working member including a first cutting portion at one end thereof and a first arm portion at the other end thereof, said first arm portion being secured to a side wall of said housing adjacent said front end thereof and including an elongated planar surface disposed within the interior of the housing and extending longitudinally thereof, said planar surface being offset from said central axis, said first cutting portion being inwardly offset from said first arm portion and being in general alignment with said central axis, an elongated movable working member including a second cutting portion at one end thereof and a second arm portion at the other end thereof, said movable and stationary working members being pivotally secured to each other intermediate their ends for pivoting movement of the movable working member about a pivotal axis transverse to said central axis, said second arm portion being inclined from said second cutting portion in a plane perpendicular to said pivotal axis to provide closing of said second cutting portion relative to said first cutting portion upon spreading of said second arm portion relative to said first arm portion, said housing including a cylindrical chamber having a piston reciprocal therein, a piston rod co-axial with said central axis and having the rear end thereof secured to said piston, a roller mounted on the front end of the piston rod, which roller is adapted to roll on said planar surface during reciprocal movement of said piston, said housing including finger actuated means for admitting a fluid under pressure into said chamber for imparting forward movement to said piston, a link having one end thereof pivotally secured to the front end of said piston rod and having the other end thereof pivotally secured to said second arm portion for spreading of the latter relative to said first arm portion upon forward movement of the piston, whereby said roller prevents disalignment of said piston rod when a piece of work is being severed by said first and second cutting portions.

4. A fluid pressure operated tool comprising, a generally cylindrical housing, an elongated first working member supported by the housing and having a first working portion at one end thereof and a first arm portion at the other end thereof, a second working member having a second working portion at one end thereof and a second arm portion at the other end thereof, said first and second working members being pivotally secured to each other intermediate their ends for pivoting movement of the second working member relative to the first working member, said housing including a cylindrical chamber having a piston reciprocal therein, a piston rod having the rear end thereof secured to said piston, linkage means connecting the front end of said piston rod with said second arm portion, said first and second working members being mutually configured to provide closing of said second working portion relative to said first working portion upon movement of the piston in a first direction, said housing including finger actuated means for admitting a fluid under pressure into said chamber for imparting movement to said piston in said first direction, spring means in said housing urging said piston in a second direction opposite of said first direction for opening said second working portion relative to said first working portion, said housing including a bore in the end thereof remote from said working members, a cylindrical element mounted in said bore for rotating movement only, which element has one end thereof projecting into said chamber and the other end thereof disposed exteriorly of the housing to permit manual rotation of the element, said piston and said element having respective cam formations fixed thereto, said cam formations being effective by contact with each other to vary the stroke of said piston solely upon rotation of said element.

5. A fluid pressure operated cutting tool comprising, a generally cylindrical housing, an elongated stationary working member extending longitudinally of the housing and having a first cutting portion at one end thereof and a first arm portion at the other end thereof, which first arm portion is secured to said housing adjacent a front end of the latter, a movable working member having a second cutting portion at one end thereof and a second arm portion at the other end thereof, said stationary and movable working members being pivotally secured to each other intermediate their ends for pivoting movement of the movable working member on the stationary working member, said stationary and movable working members being mutually configured to provide closing of said second cutting portion relative to said first cutting portion upon spreading of said second arm portion relative to said first arm portion, said housing including a cylindrical chamber having a piston reciprocal therein, a piston rod having the rear end thereof secured to said piston, linkage means connecting the front end of said piston rod with said second arm portion for spreading of the latter relative to said first arm portion upon forward movement of the piston, said housing including finger actuated means for admitting a fluid under pressure into said chamber for imparting forward movement to said piston, spring means in said housing urging said piston rearwardly in said chamber for opening said second cutting portion relative to said first cutting portion, said piston including a rear face having an elongated cam surface projecting therefrom, said housing having a bore in the rear portion thereof opening into said chamber, a shaft journaled in said bore and having a transversely extending arm on the inner end thereof and finger gripping means on the outer end thereof, which arm is adapted to engage said cam surface at a point along the length of the latter for limiting the rearward stroke of said piston, whereby the rearward stroke of said piston may be varied by rotation of said shaft by said finger gripping means for adjusting the maximum opening between said first and second cutting portions.

6. The structure according to claim 5 wherein said cam surface is defined by a curved wall having its center of curvature at the longitudinal central axis of said chamber, which wall has a uniformly increasing height along the length thereof, and wherein said shaft is co-axial with said axis.

References Cited by the Examiner

UNITED STATES PATENTS

| | | | |
|---|---|---|---|
| 492,931 | 3/1893 | Baird | 30—180 |
| 2,488,224 | 11/1949 | Mothorn | 30—228 X |
| 2,493,696 | 1/1950 | Potstada | 30—228 |
| 2,751,940 | 6/1956 | Miller | 30—228 X |
| 2,815,004 | 12/1957 | Droman | 30—228 X |
| 2,942,507 | 6/1960 | Fischer et al. | 30—180 X |
| 2,990,613 | 7/1961 | Keane et al. | 30—180 |

WILLIAM FELDMAN, *Primary Examiner.*

MILTON S. MEHR, *Examiner.*

J. C. PETERS, *Assistant Examiner.*